United States Patent [19]

Thomas

[11] Patent Number: 4,696,095
[45] Date of Patent: Sep. 29, 1987

[54] PROCESS FOR ISOLATION USING SELF-ALIGNED DIFFUSION PROCESS

[75] Inventor: Mammen Thomas, San Jose, Calif.

[73] Assignee: Advanced Micro Devices, Inc., Sunnyvale, Calif.

[21] Appl. No.: 844,908

[22] Filed: Mar. 27, 1986

[51] Int. Cl.$^4$ ............................................. H01L 21/31
[52] U.S. Cl. ...................... 437/78; 156/653; 156/657; 437/89; 437/913; 437/962; 437/981
[58] Field of Search ............. 29/576 W, 579; 357/50; 156/643, 644, 649, 651, 652, 653, 654, 657

[56] References Cited

FOREIGN PATENT DOCUMENTS

| | | | |
|---|---|---|---|
| 0060851 | 4/1982 | Japan | 29/576 W |
| 0134443 | 8/1983 | Japan | 29/576 W |
| 0084435 | 5/1984 | Japan | 29/576 W |

OTHER PUBLICATIONS

Benjamin, IBM Technical Disclosure Bulletin, vol. 22, No. 7, Dec. 1979, "Self-Aligned Recessed Oxide . . . Formation", pp. 2749-2750.

*Primary Examiner*—Brian E. Hearn
*Assistant Examiner*—Kevin McAndrews
*Attorney, Agent, or Firm*—Patrick T. King; David W. Collins

[57] ABSTRACT

A process is disclosed for improving the isolation between semi-oxide insulated devices, formed on mesa structures. In the fabrication of such devices, a silicon substrate is provided. Patterned regions of one type of conductivity are formed in a major surface of the substrate and an epitaxial layer of silicon is formed on the substrate over the major surface. A patterned mask layer is formed on the epitaxial layer and is etched to expose portions of the epitaxial layer. The exposed portions of the epitaxial layer are removed to form the mesa structures, which overlie the doped patterned regions. Regions of opposite conductivity, called channel stops, are then formed in the substrate between the patterned regions. After filling in the areas between the mesa structures with a field oxide, the devices (bipolar or MOS transistors) are formed on the mesa structures.

The process of the invention utilizes as a mask structure a mask having a combination of properties (composition and thickness) related to the subsequent processing. The mask permits use of an anisotropic etchant to define the mesa structures and to undercut the mask. An oxide layer is formed on the side walls of the mesa structures and on those portions of the substrate exposed during the mesa-defining step. Those portions of the oxide layer underlying openings in the mask structure are removed to expose portions of the substrate, which encompass regions between the doped patterned regions. The channel stop dopant is introduced into the regions between the patterned regions.

34 Claims, 6 Drawing Figures

PROCESS FOR ISOLATION USING SELF-ALIGNED DIFFUSION PROCESS

BACKGROUND OF THE INVENTION

1. Field of the Invention

This invention relates to a process for fabricating a plurality of semiconductor devices on a single substrate, and, more particularly, to a process for improving the isolation between such devices.

2. Description of the Related Art

Bipolar integrated devices are manufactured on silicon wafers having a buried layer which is patterned to provide low collector resistance over a P-type substrate over which an epitaxial layer is grown. It is necessary to isolate one device from the next. This has in the past been done by creating an island or mesa structure of an N-type epitaxial layer including the buried layer by masking and diffusing a P-type plug from the surface. Thermal oxidation is then provided with a separate mask to define active regions within the island.

The thermal drive required to drive the P-type impurity into the P-type substrate between the buried layers also allows lateral diffusion, thereby making the island itself smaller. It is also necessary to keep the devices fabricated on the island away from the diffusion. Hence, close packing of the devices to improve density is difficult. The P region with the N epi layer also increases the capacitance values and reduces circuit speed. Further, formation of the field oxide between the islands tends to reduce the active area on the islands available for the fabrication of devices thereon.

In order to reduce the drive requirement of diffusion, an etch has been introduced which etches the isolation regions down part way prior to diffusion. This reduces the side diffusion of the P-type dopant, but it still has the problem of requiring the devices to be spaced away from the side of the isolation etch and diffusion, which limits the feasibility of high density products such as gate arrays.

This process also has the disadvantage of completely diffused isolation in that it still has higher capacitance due to the P region in the epitaxial layer along the side wall of the isolation oxide. Again, formation of the field oxide between the islands tends to reduce the active area on the islands for the fabrication of devices thereon.

A need remains for a process which reduces unwanted diffusion of the P-type dopant and also eliminates it from the side wall oxide region and thereby reduces capacitance, increases the active area available to allow closer packing of devices and provides good isolation with diffused channel stops.

SUMMARY OF THE INVENTION

Accordingly, it is an object of the present invention to provide a process for fabricating semi-oxide insulating devices having improved isolation between the devices.

It is another object of the present invention to provide a process for fabricating semi-oxide insulating devices in which the channel stop region is formed without excessive overlap with the buried layer structures.

It is a further object of the invention to provide a process for fabricating semi-oxide insulating devices in which the channel stop is formed by a diffusion process, with the channel stop self-aligned between the buried layer structures.

It is yet another object of the present invention to provide a process for fabricating semi-oxide insulating devices in which the devices are placed as close together as the processing will allow, in order to improve packing density of the devices.

Briefly, in the process of the invention, after formation of an epitaxial semiconductor layer on a substrate in which the buried layer structure is formed, portions of the epitaxial layer are removed to define the mesa structures, thereby exposing portions of the substrate. A masking layer over the epitaxial layer is used to define the mesa structures and permit the removal of unwanted material. The mesa structures overlie the buried layer structure, which has previously been patterned to provide areas in which the channel stops will be formed between the mesa structures.

In accordance with the invention, the mesa structures are formed in the epitaxial layer by use of an etchant which is at least partially anisotropic, which removes those portions of the epitaxial layer exposed by openings in the mask layer and undercuts the overlying mask layer. The side walls of the mesa structure and exposed portions of the substrate are oxidized to form a thin protective oxide layer. The portions of the oxide directly beneath the openings in the mask layer are removed to expose the underlying portions of the substrate and thus those undoped regions between the patterned buried layer structure. The species used to form the channel stop is diffused into the exposed portions of the substrate, and the substrate is annealed to remove any damage caused by the diffusion. Finally, a field oxide is formed to fill in the areas between the mesa structures. Devices are then fabricated in the mesas, employing conventional techniques, Devices formed by the process of the invention evidence greater isolation than achieved by other processes. Further, device speed is improved due to reduction in capacitance, since a thick oxide instead of P-diffusion is used for device isolation. Finally, devices may be packed more closely, thereby increasing the number of devices that may be formed on a wafer. This arises due to eliminating the lateral spread of the P-diffusion. Consequently, devices contacting the oxide side wall may be fabricated.

The process of the invention may also advantageously be employed to provide isolated mesa structures for MOS devices, using appropriately doped substrate materials and diffusion species.

Other objects, features and advantages of the present invention will become apparent upon consideration of the following detailed description and accompanying drawings, in which like reference designations represent like features throughout the FIGURES.

BRIEF DESCRIPTION OF THE DRAWINGS

The drawings referred to in this description should be understood as not being drawn to scale except if specifically noted. Moreover, the drawings are intended to illustrate only one portion of an integrated circuit fabricated in accordance with the present invention.

DETAILED DESCRIPTION OF THE INVENTION

Reference is made now in detail to a specific embodiment of the present invention, which illustrates the best mode presently contemplated by the inventor for practicing the invention. Alternative embodiments are also briefly described as applicable.

Figure 1A:
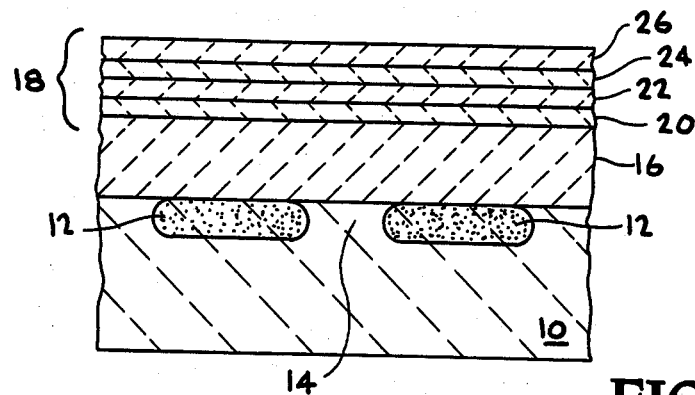
FIGS. 1a-f depict, in cross-section, the sequence of processing steps in accordance with the invention.

FIG. 1a depicts a substrate 10 in which a patterned set of buried layer regions 12 are formed. A region 14 is left between adjacent buried layer regions 12; it is in this region that a channel stop region will subsequently be formed. Further, it will be appreciated that a plurality of mesa structures will eventually be formed, with each mesa structure registered so as to overlie a buried layer region 12.

In the particular embodiment disclosed herein, the substrate 10 comprises silicon, processed in a conventional manner so as to provide the buried layer regions 12. However, it will be appreciated that other semiconductor materials may also be suitably employed in accordance with the teachings herein. Further, it will be appreciated that changes in dopants and conductivity type may be made in employing the process of the invention.

The buried channel regions 12 are formed in the substrate employing conventional silicon processing technology. In particular, the regions 12 are defined by the use of masks, with a dopant introduced, such as by diffusion, into exposed regions of the substrate 10. In this embodiment, an N region is formed, using antimony as the dopant species. The buried channel regions are typically doped to a level of about $10^{19}$ to $10^{20}$ cm$^{-3}$. The regions 12 are about 3 to 3.5 micrometers thick, as is common in this art, and have a resistivity of about 5 ohms/square.

An epitaxial layer 16 of silicon is next formed on the substrate 10 with its buried channel regions 12. The epi layer 16 is conveniently formed by thermal decomposition of a silicon-containing species, such as silane, as is well-known. The epi layer 16 is typically grown to a thickness of about 1 to 2.5 micrometers.

A mask structure 18 is formed on the exposed surface of the epi layer 16. While a number of different mask structures may be employed, one that is preferred comprises a first layer 20 of a buffer oxide, a second layer 22 of silicon nitride, a third layer 24 of undoped silicon dioxide and a fourth layer 26 of silicon nitride. An undoped deposited layer of oxide is preferred, since such an oxide, after thermal densification has the same etch rate as a thermally grown oxide, which is slower than the etch rate of a doped layer is a wet chemical etch.

Other examples of suitable mask structures include silicon nitride and metal. The thickness of such single material mask layers should be sufficient to prevent complete removal during sebsequent etching. The metal used should have a high selectivity to the etchant, and the thickness range will depend on the selectivity. For example, Ti-W may be used, depending on the etchant solution for silicon and selectivity to plasma oxide etch, which vary from equipment to equipment and with chemical composition.

The buffer oxide layer 20 is thermally grown, employing well-known processing parameters, to a thickness of about 300 to 500 Angstroms (Å). The silicon nitride layers 22, 26 are conveniently formed by chemical vapor deposition (CVD), also employing well-known processing parameters. The innermost silicon nitride layer 22 is formed to a thickness of about 1000 to 1200 Å, while the outermost silicon nitride layer 26 is formed to a thickness of about 700 to 1000 Å. Conveniently, the silicon dioxide layer 24 is a comparatively low temperature oxide, deposited at a temperature of about 450° C. and formed to a thickness of about 1500 to 2000 Å. Advantageously, the Silox process, which is a thermal decomposition of gases to deposit the oxide, is employed.

Figure 1B:
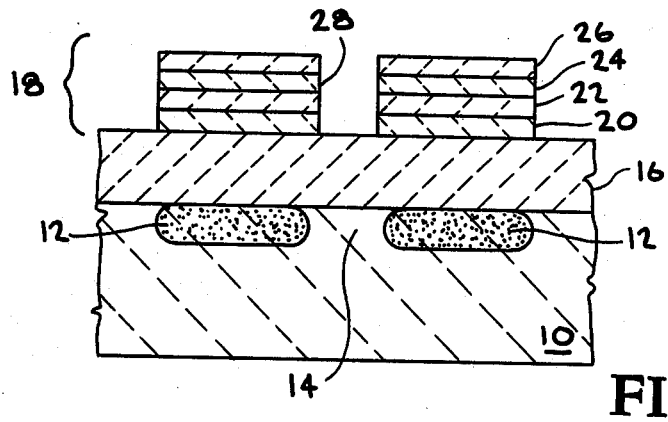

The mask structure 18 is etched, as shown in FIG. 1b, to expose portions of the epi layer 16. An active mask, used for defining the active area of the mesa structure, such as photoresist (not shown), is used to define the portions of the mask layer 18 to be removed. Plasma etching, employing fluorine chemistry, such as CF$_4$ or CHF$_3$, is used to etch through the component layers of the mask structure 18. Openings 28 are thereby formed in the mask structure 18 and have a diameter of about 1.2 to 2 micrometers. The mask openings are registered by techniques well-known in this art to lie only above those regions 14 between the patterned buried layer regions 12.

Up to this stage in the processing, the use of a mask layer 18 to define the portions of the epi layer 16 to be exposed is conventional. However, the particular component layers of the mask layer 18, namely, layers 20, 22, 24 and 26 of oxide, nitride, oxide and nitride, respectively, and their thicknesses are uniquely coupled to the processing sequence of the invention, as described below.

Figure 1C:
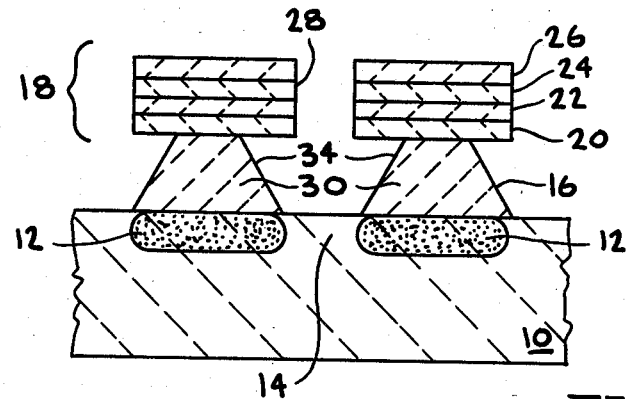

In accordance with the invention, the epi layer 16 is etched, employing an etchant which is at least partially anisotropic, to expose portions of the underlying substrate 10 and thereby form mesa structures 30, as depicted in FIG. 1c. In particular, the epi layer 16 is preferably formed with the (100) plane parallel to the substrate 10. The anisotropic etchant is one which preferentially etches along a particular direction. In this case, it is desired to undercut the mask structure 18. Thus, for (100) silicon, an etchant which etches least on the (111) plane is preferred. Such etchants are well-known in this art, and include chromium trioxide/HF, for example. The result is an undercut, which is at an angle of about 47° to 57°, depending upon the etchant composition used.

It is not necessry to completely etch down to the substrate 10 if thermal oxidation will be subsequently employed, as described below, since the thermal oxidation would consume part of the remaining silicon. However, the etching should be close enough to the substrate 10 to ensure that the P-diffusion in the region 14 between the buried layers 12 at the end of the process disclosed herein will be well-defined and that the oxide formed by the thermal oxidation will consume the remaining N-type material comprising the epi layer 16 between the mesa structures 30 and thereby provide good isolation between the mesa structures 30.

Figure 1D:
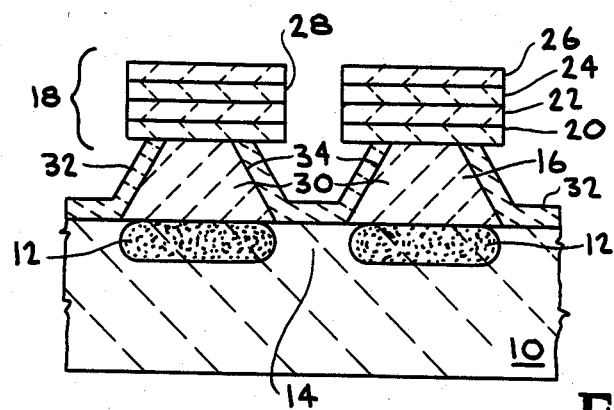

An oxide layer 32 is formed on the side walls 34 of the mesas 30 and the exposed portions of the substrate 10, as shown in FIG. 1d. The oxidation is preferably performed by the well-known dry thermal process, which is carried out at about 1000° C.

The oxide layer 32 is formed to a thickness sufficient to prevent diffusion of the dopant, which will subsequently be used to form the channel stop, into the underlying semiconductor material. For this particular embodiment, in which the diffused species is boron, a thickness of at least about 1000 Å is adequate. The upper limit is dictated by economic considerations, since portions of the oxide layer 32 will be subsequently removed, and thus should be as thin as possible. Consistent with this consideration, the upper limit is about 1500 Å.

Figure 1E:
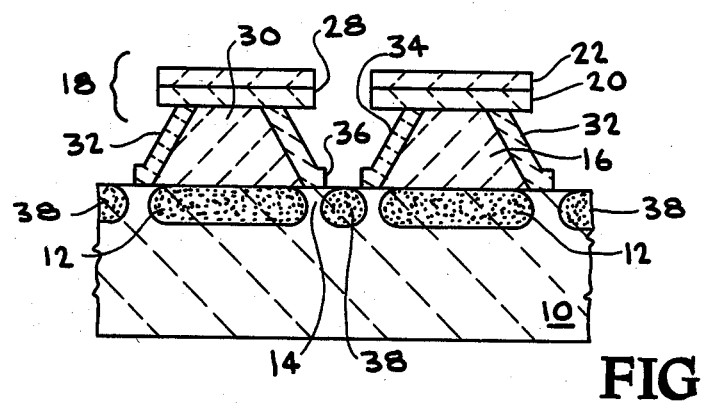
Figure 1F:
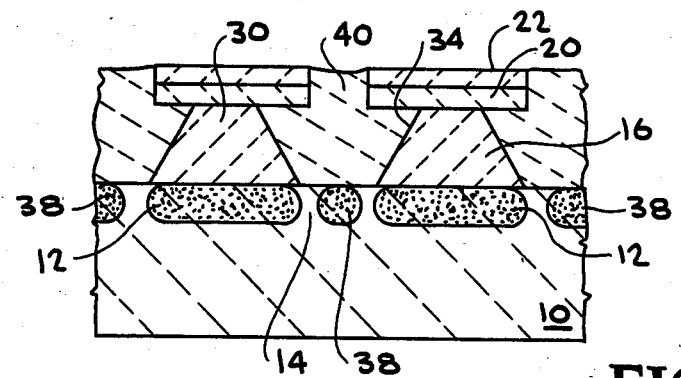

Openings 36 are formed in the oxide layer 32 to expose portions of the substrate 10, as depicted in FIG. 1e. In particular, the openings 36 are registered to expose the regions 14, which lie between the buried layer regions 12.

The openings 36 are formed by reactive ion etching (RIE), which etches the silicon dioxide layer 32. Fluorine chemistry, as described above, is conveniently employed to generate fluoride ions for the etching process.

It will be appreciated that since there is no layer to naturally stop the etching process when the oxide layer 32 is completely etched through, then the process is dependent on the known etching rate. In particular, to ensure complete etching, the oxide layer 32 is over-etched to the extent of about 200 Å. In this connection, the thickness of the oxide layer 24 given above as ranging from about 1500 to 2000 Å, is predetermined to be at least about 200 Å greater than that of the oxide layer 32, since the silicon nitride layer 26 will be completely removed and the oxide layer 24 will be partially removed during the RIE process.

A dopant species is introduced into the exposed regions of the substrate 10 through the openings 36 to form channel stops 38 in the regions 14, as shown in FIG. 1e. Where the buried layer is N-type, the channel stop is P-type, conveniently employing boron as the dopant species. The dopant is preferably introduced by a diffusion process, carried out at about 750° to 1000° C., as is well-known is this art. However, other means of introducing the dopant, such as by ion beam, may also be employed, making suitable adjustment in dopant species and oxide thickness, as is well-known in the art.

BCl$_3$ is advantageously employed as the diffusion source. The P+ channel stops 38 have a dopant concentration, after drive, of about $10^{18}$ to $10^{19}$ cm$^{-3}$.

The structure is annealed, primarily to remove any damage caused by the introduction of the dopant. The annealing is done at about 850° C. for about 30 minutes, although lower temperatures associated with longer times or higher temperatures associated with shorter times may also be employed.

The oxide layer 24 is removed by a wet dip etchant, employing a buffer oxide etch solution, such as NH$_4$F solution, which is commercially available, or an aqueous solution of HF. The etchant also removes a portion of the side wall oxide 32, but since a portion of the undoped oxide layer 24 has previously been removed, the side wall oxide 32 may not be completely removed.

A field oxide layer 40 is next formed, advantageously employing a dry oxygen/steam process, well-known in this art for growing a layer of silicon dioxide. For the dimensions of the various layers given herein, a typical time for the oxidation process is about 180 minutes, although there will be some variation. Commonly, it is desired to form the field oxide 40 to about the same thickness as the epi layer 16.

The oxide 40 separating the structures 16 can also be formed by depositing and planarizing to the first silicon nitride layer 22. Alternatively, the filler 40 can comprise polysilicon with an oxidation to define the active areas.

The remaining layers of the mask layer 18, namely, the buffer oxide layer 20 and the silicon nitride layer 22, act as a mask during the formation of the field oxide layer 40, thereby preventing unwanted consumption of the active area of the mesa structures 30. The wafer is subsequently processed, employing conventional parameters, to form devices (not shown), such as bipolar or MOS transistors, on the mesas. Such additional processing is conventional and forms no part of this invention.

In the prior art, reactive ion etching could not be employed to form the opening in the silicon dioxide overlying the undoped regions between the buried structures without also removing the side wall oxide. Further, the region for diffusing in the dopant species to form the channel stop would not be well defined.

Thus, it will be appreciated that employing an anisotropic etchant to undercut the mask 18, followed by oxidation of the side walls 34 of the mesa structures 30 and the exposed surface of the substrate 10 and then removing only those portions of the oxide directly beneath the openings 28 in the mask 18 will result in self-aligned channel stop regions 38, having the desired dimensions and characteristics.

The foregoing description of the preferred embodiment of the present invention has been presented for purposes of illustration and description. It is not intended to be exhaustive or to limit the invention to the precise form disclosed. Obviously, many modifications and variations will be apparent to practitioners skilled in this art. It is possible that the invention may be practiced in other fabrication technologies in MOS or bipolar processes. Similarly, any process steps described might be interchangeable with other steps in order to achieve the same result. The embodiment was chosen and described in order to best explain the principles of the invention and its practical application, thereby enabling others skilled in the art to understand the invention for various embodiments and with various modifications as are suited to the particular use contemplated. It is intended that the scope of the invention be defined by the claims appended hereto and their equivalents.

What is claimed is:

1. In a process for fabricating semi-oxide insulated devices, which includes providing a substrate, forming patterned regions of a first conductivity type in a major surface of said substrate, forming an epitaxial layer on said substrate over said major surface, forming a patterned mask layer on said epitaxial layer so as to define openings therethrough to expose portions of said epitaxial layer, removing said exposed portions of said epitaxial layer to define mesa structures which overlie said patterned regions of said first conductivity type, forming regions of a second conductivity type in said substrate between said patterned regions, forming a field oxide between said mesa structures, and forming devices on said mesa structures, wherein said devices are isolated from each other by said regions of said second conductivity type, the improvement which comprises:

(a) employing as said patterned mask a mask consisting essentially of a material selected from the group consisting of (1) a multilayer structure comprising at least two each of alternating layers of silicon dioxide and silicon nitride, (2) silicon nitride and (3) metal;

(b) removing said exposed portions of said epitaxial layer by a partially anisotropic etchant to undercut portions of said patterned mask, form said mesa structures having side walls, and expose portions of said substrate;

(c) forming an oxide layer on said side walls of said mesa structure and on said exposed portions of said substrate;

(d) removing said oxide layer lying under said openings in said patterned mask to expose corresponding regions of said substrate, said corresponding regions lying between said patterned regions; and (e) forming said regions of said second conductivity in said corresponding regions through openings in said oxide layer.

2. The process of claim 1 wherein said substrate comprises silicon.

3. The process of claim 1 wherein said patterned regions of said first conductivity type are doped with an N-type dopant.

4. The process of claim 1 wherein said patterned mask comprises a first layer of a buffer oxide, a second layer of silicon nitride, a third layer of undoped silicon dioxide and a fourth layer of silicon nitride.

5. The process of claim 4 wherein said first layer is formed to a thickness of about 300 to 500 Å, said second layer is formed to a thickness of about 1000 to 1200 Å, said third layer is formed to a thickness of about 1500 to 2000 Å and said fourth layer is formed to a thickness of about 700 to 1000 Å.

6. The process of claim 5 wherein said first layer is formed by a thermal process; said second and fourth layers are formed by a chemical vapor deposition process and said third layer is formed by an oxidation deposition process.

7. The process of claim 1 wherein said openings in said mask are formed by etching through portions of said mask with a plasma.

8. The process of claim 1 wherein said epitaxial layer comprises silicon and is formed with its (100) planes parallel to said major surface of said substrate.

9. The process of claim 8 wherein said epitaxial layer is etched by said anisotropic etchant which etches least along the (111) plane.

10. The process of claim 1 wherein said oxide is formed on the side walls of said mesa structures and on said exposed portions of said substrate by a dry thermal process.

11. The process of claim 10 wherein said oxide is formed to a thickness of about 1000 to 1500 Å.

12. The process of claim 10 wherein said exposed portions of said epitaxial layer are removed by said at least partially anisotropic etchant to the extent that any epitaxial layer remaining over said substrate is completely converted to oxide by said dry thermal process.

13. The process of claim 1 wherein that portion of said oxide layer underlying said openings is removed by reactive ion etching, employing fluoride ions.

14. The process of claim 1 wherein said regions of said second conductivity are doped with a P-type dopant.

15. The process of claim 14 wherein said P-type dopant consists essentially of boron.

16. The process of claim 15 wherein said boron is introduced by a diffusion process.

17. The process of claim 14 wherein said substrate carrying said mesa structures is annealed to remove damage caused by introducing said dopant.

18. The process of claim 1 wherein said mask layer comprises a thick silicon nitride.

19. The process of claim 1 wherein said mask layer comprises a metal mask.

20. In a process for fabricating semi-oxide insulated devices, which includes providing a silicon substrate, forming N-type doped patterned regions in a major surface of said substrate, forming an epitaxial silicon layer on said substrate over said major surface, forming a patterned mask layer on said epitaxial layer to expose portions of said epitaxial layer, removing said exposed portions of said epitaxial layer to define mesa structures which overlie said patterned regions, forming P+-type doped regions in said substrate between said patterned regions, forming a field oxide between said mesa structures, and forming devices on said mesa structures, wherein said devices are isolated from each other by said P+-type regions, the improvement which comprises:

(a) forming said epitaxial layer having a crystallographic orientation of its (100) planes parallel to said major surface of said substrate;

(b) forming said patterned mask so as to define openings therethrough, said patterned mask comprising a first layer of a buffer silicon dioxide, a second layer of silicon nitride, a third layer of undoped silicon dioxide and a fourth layer of silicon nitride;

(c) removing said exposed portions of said epitaxial layer by a partially anisotropic etchant which etches least along the (111) planes of said epitaxial layer to undercut portions of said patterned mask, form said mesa structures having side walls, and expose portions of said substrate;

(d) forming a silicon dioxide layer on said side walls of said mesa structures and on said exposed portions of said substrate;

(e) removing said silicon dioxide layer lying under said openings in said patterned mask by reactive ion etching to expose corresponding regions of said substrate, said corresponding regions lying between said patterned regions; and (f) forming said P+-type regions in said corresponding regions by introducing a P-type dopant through openings in said silicon dioxide.

21. The process of claim 20 wherein said first layer is formed to a thickness of about 300 to 500 Å, said second layer is formed to a thickness of about 1000 to 1200 Å, said third layer is formed to a thickness of about 1500 to 2000 Å and said fourth layer is formed to a thickness of about 700 to 1000 Å.

22. The process of claim 21 wherein said first layer is formed by a thermal process; said second and fourth layers are formed by a chemical vapor deposition process and said third layer is formed by a low temperature Silox process.

23. The process of claim 20 wherein said openings in said mask are formed by etching said mask with a plasma.

24. The process of claim 20 wherein said silicon dioxide is formed on the side walls of said mesa structures and on said exposed portions of said substrate by a dry thermal process.

25. The process of claim 24 wherein said oxide is formed to a thickness of about 1000 to 1500 Å.

26. The process of claim 20 wherein said P-type dopant consists essentially of boron.

27. The process of claim 26 wherein said boron is introduced by a diffusion process.

28. The process of claim 20 wherein said substrate carrying said mesa structures is annealed to remove damage caused by introducing said dopant.

29. A process for fabricating semiconductor devices on a plurality of mesa structures supported on a silicon substrate, including:
  (a) forming N-type doped patterned regions in a major surface of said substrate;
  (b) forming an epitaxial silicon layer on said substrate over said major surface, said epitaxial silicon layer having a crystallographic orientation of its (100) planes parallel to said major surface;
  (c) forming a patterned mask layer on said epitaxial layer, said patterned mask comprising a first layer of silicon dioxide, a second layer of silicon nitride, a third layer of undoped silicon dioxide and a fourth layer of silicon nitride;
  (d) forming openings in said patterned mask layer to expose portions of said epitaxial layer;
  (e) removing said exposed portions of said epitaxial layer to define mesa structures which overlie said patterned regions, said exposed portions being removed by use of an anisotropic etchant which etches least along the (111) planes of said epitaxial layer to undercut portions of said patterned mask;
  (f) forming a silicon dioxide layer on side walls of said mesa structures and on exposed portions of said substrate;
  (g) removing those portions of said silicon dioxide layer lying under said openings in said patterned mask to expose corresponding regions of said substrate, said corresponding regions lying between said patterned regions;
  (h) diffusing a P-type dopant to form $P^+$-type doped regions in said substrate between said patterned regions;
  (i) annealing said substrate carrying said mesa structures to remove damage caused by introducing dopant to form said doped regions;
  (j) forming a field oxide between said mesa structures; and
  (k) forming devices on said mesa structures, wherein said devices are isolated from each other by said $P^+$ regions.

30. The process of claim 29 wherein said first layer is formed to a thickness of about 300 to 500 Å, said second layer is formed to a thickness of about 1000 to 1200 Å, said third layer is formed to a thickness of about 1500 to 2000 Å and said fourth layer is formed to a thickness of about 700 to 1000 Å, with said third layer being at least about 200 Å thicker than said silicon dioxide layer formed on said side walls of said mesa.

31. The process of claim 29 wherein said openings in said silicon dioxide layer formed on said substrate are etched by reactive ion etching.

32. The process of claim 31 wherein said reactive ion consists essentially of fluoride.

33. The process of claim 29 wherein said silicon oxide layer formed on said side walls of said mesa structures ranges in thickness from about 1000 to 1500 Å.

34. The process of claim 29 wherein said P-type dopant consists essentially of boron.

* * * * *